United States Patent
Lee

(10) Patent No.: US 7,692,276 B2
(45) Date of Patent: Apr. 6, 2010

(54) THERMALLY ENHANCED BALL GRID ARRAY PACKAGE FORMED IN STRIP WITH ONE-PIECE DIE-ATTACHED EXPOSED HEAT SPREADER

(75) Inventor: Jerold Lee, Union City, CA (US)

(73) Assignee: Broadcom Corporation, Irvine, CA (US)

( * ) Notice: Subject to any disclaimer, the term of this patent is extended or adjusted under 35 U.S.C. 154(b) by 302 days.

(21) Appl. No.: 11/836,582

(22) Filed: Aug. 9, 2007

(65) Prior Publication Data

US 2009/0039485 A1 Feb. 12, 2009

(51) Int. Cl.
*H01L 23/495* (2006.01)
(52) U.S. Cl. .................. 257/676; 257/666; 257/673; 438/111; 438/118
(58) Field of Classification Search ................. 257/666, 257/676, 673, E27.137, E27.144; 438/111, 438/112, 118
See application file for complete search history.

(56) References Cited

U.S. PATENT DOCUMENTS

| 7,061,080 B2* | 6/2006 | Jeun et al. .................. 257/676 |
| 7,105,377 B1* | 9/2006 | Chang et al. ................. 438/110 |
| 7,288,838 B2* | 10/2007 | Nakano ....................... 257/698 |
| 2007/0278664 A1* | 12/2007 | Carney et al. ................ 257/706 |
| 2008/0073778 A1* | 3/2008 | Edwards ...................... 257/712 |

* cited by examiner

*Primary Examiner*—Phuc T Dang
(74) *Attorney, Agent, or Firm*—Fiala & Weaver, P.L.L.C.

(57) ABSTRACT

Methods, systems, and apparatuses for integrated circuit packages, such as ball grid array packages, and processes for assembling the same, are provided. A first strip includes an array of package substrate sections. An IC die is mounted to each package substrate section of the first strip. A second strip includes an array of leadframe sections. The second strip is positioned adjacent to the first strip to couple a planar protruding area of each leadframe section to a corresponding IC die mounted to the first strip. An encapsulating material is applied to the adjacently positioned first and second strips to fill a space between the first and second strips and to fill a cavity in a top surface of each leadframe section. A planar region of the first strip surrounding each centrally located cavity is not covered by the encapsulating material. The adjacently positioned first and second strips are singulated into a plurality of IC packages.

21 Claims, 8 Drawing Sheets

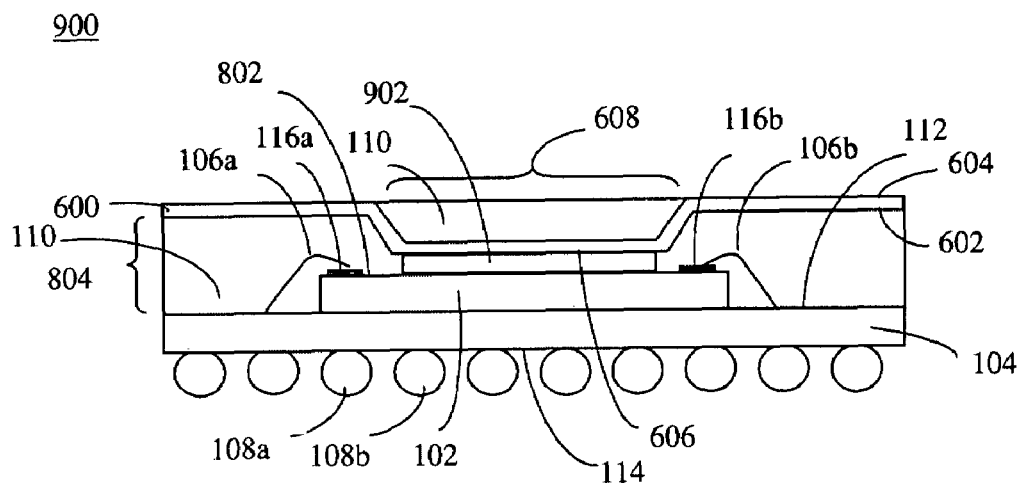

```
                                    ┌ 1002
┌─────────────────────────────────────────────┐
│ mount an IC die to each package substrate section on a first surface │
│ of a first strip that includes an array of package substrate sections │
└─────────────────────────────────────────────┘
                       │
                                    ┌ 1004
┌─────────────────────────────────────────────────────────────────┐
│ position a first surface of a second strip that includes an array of leadframe sections │
│ adjacent to the first surface of the first strip to couple a planar protruding area of each │
│ leadframe section to a corresponding IC die mounted to the first surface of the first strip │
└─────────────────────────────────────────────────────────────────┘
                       │
                                    ┌ 1006
┌─────────────────────────────────────────────────────────────────┐
│ apply an encapsulating material to the adjacently positioned first and second strips │
│ to fill a space between the first and second strips and to fill a centrally located │
│ cavity of each lead frame section at a second surface of the second strip │
└─────────────────────────────────────────────────────────────────┘
                       │
                                    ┌ 1008
┌─────────────────────────────────────────────────────────────────┐
│ singulate the adjacently positioned first and second strips into a plurality of IC packages │
└─────────────────────────────────────────────────────────────────┘
```

FIG. 10

THERMALLY ENHANCED BALL GRID ARRAY PACKAGE FORMED IN STRIP WITH ONE-PIECE DIE-ATTACHED EXPOSED HEAT SPREADER

BACKGROUND OF THE INVENTION

1. Field of the Invention

The present invention relates to integrated circuit packaging technology, and more particularly, to thermally enhanced integrated circuit packages.

2. Background Art

Integrated circuit (IC) chips or dies from semiconductor wafers are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

BGA packages are available in a variety of types. Example types of BGA packages include plastic BGA (PBGA) packages, flex BGA packages, ceramic BGA packages, fine pitch BGA (FPBGA or FBGA) packages, and wafer-level BGA (WLBGA) packages. In a typical BGA package, a chip is mounted to a substrate by a die attach material. In one type of package implementation, wirebonds electrically connect signals of the die to conductive features on the substrate. In another implementation, the die is flip-chip mounted to the substrate, and solder bumps are used to electrically connect signals of the die to conductive features on the substrate. An encapsulating material encapsulates the die, wirebonds (when present), and the top surface of the substrate. FBGA packages have solder balls that are smaller than those of other BGA package types, such as plastic, ceramic, and flex BGA packages, and a smaller ball pitch is used to space the solder balls.

Existing BGA packages are subject to high thermal stresses that result from the heat given off during operation of the mounted IC die. It is desirable to transfer the heat generated by the IC die from the package during operation to prevent damage to the package. Frequently, the material of the package substrate has very low values of thermal conductivity. Consequently, the IC die is typically separated from the PCB to which the package is mounted by the internal substrate thermal barrier. A large amount of research is being performed into relieving BGA package thermal stresses, and many BGA package configurations have been implemented over the years that attempt to remove excess package heat.

Millions of integrated circuit packages are needed each year to interface integrated circuit chips with devices. Thus, what are needed are improved packaging techniques that can help meet the high quantity production needs for integrated circuit packages, while addressing the need to produce packages that are efficient at removing excess heat.

BRIEF SUMMARY OF THE INVENTION

Methods, systems, and apparatuses for integrated circuit packages, and processes for assembling the same, are provided. In a first example aspect, an integrated circuit package includes a substrate, an integrated circuit die, a leadframe, and an encapsulating material. The substrate has a plurality of contact pads on a first surface of the substrate that are electrically connected through the substrate to a plurality of solder ball pads on a second surface of the substrate. The die is mounted to the first surface of the substrate. The leadframe has a planar protruding area extending from a first surface of the leadframe and a centrally located cavity formed in a second surface of the leadframe. The planar protruding area of the leadframe is coupled to a surface of the IC die. An encapsulating material fills a space between the substrate and leadframe and fills the centrally located cavity. The encapsulating material does not cover a planar region of the second surface of the leadframe surrounding the centrally located cavity.

In one example, the planar protruding area of the leadframe is coupled to the die through a spacer. In another example, the planar protruding area of the leadframe is attached to the die with an adhesive material. In still another example, the planar protruding area of leadframe is in direct contact with the die, without an adhesive material or spacer in between.

In another example aspect of the present invention, a process for assembling a plurality of integrated circuit packages is provided. A first strip includes an array of package substrate sections. An IC die is mounted to each package substrate section of the first strip. A second strip includes an array of leadframe sections. The second strip is positioned adjacent to the first strip to couple a planar protruding area of each leadframe section to a corresponding IC die mounted to the first strip. An encapsulating material is applied to the adjacently positioned first and second strips to fill a space between the first and second strips and to fill a cavity in a top surface of each leadframe section. However, a planar region of the first strip surrounding each centrally located cavity is not covered by the encapsulating material. The adjacently positioned first and second strips are singulated into a plurality of IC packages.

In one example, the planar protruding area of each leadframe section may be coupled to the corresponding IC die mounted to the first strip through a spacer. In another example, the planar protruding area of each leadframe section is attached to the corresponding IC die mounted to the first strip with an adhesive material. In still another example, the planar protruding area of each leadframe section is in contact with the corresponding IC die mounted the first strip.

In a further example, the encapsulating material is applied by enclosing the first strip and second strip in a mold assembly, and flowing the encapsulating material into the mold assembly. The leadframes of the second strip may include a plurality of openings to allow the encapsulating material to flow into the cavities of the leadframes.

In another example aspect of the present invention, an integrated circuit package strip assembly is provided. The strip assembly includes a first strip, a plurality of dies, a second strip, and an encapsulating material. The first strip includes an array of package substrate sections. Each IC die of the plurality of IC dies is mounted to a corresponding package substrate section on a first surface of the first strip. The second strip includes an array of leadframe sections that each include a planar protruding area extending from a first surface of the leadframe and a centrally located cavity formed in a second surface of the second strip. The second strip is coupled to the first strip such that each planar protruding area of the second strip is coupled to a corresponding mounted IC die of the first strip. The encapsulating material fills a space between the first and second strips and fills the centrally located cavity of each leadframe section. The encapsulating material does not cover a planar region of the first surface of the first strip surrounding each centrally located cavity.

In a further example, the strip assembly may include a plurality of spacers. Each spacer couples a respective planar protruding area of a leadframe section to a corresponding IC die mounted to the first surface of the first strip.

The strip assembly may be singulated to form a plurality of integrated circuit packages.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 8 and 9 show BGA packages that include the leadframe of FIGS. 6 and 7, according to example embodiments of the present invention.

FIG. 10 shows a flowchart providing a process for assembling a plurality of integrated circuit (IC) packages, according to embodiments of the present invention.

Figure 1:
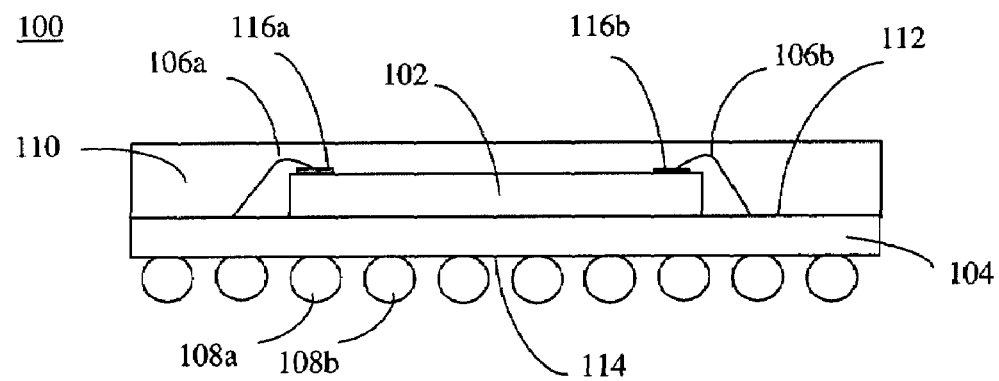
FIG. 1 shows a cross-sectional view of an example BGA package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Ball Grid Array Packages

FIG. 1 shows a cross-sectional view of an example BGA package 100. BGA package 100 may be a plastic BGA (PBGA) package, a flex BGA package, a ceramic BGA package, a fine pitch BGA (FPBGA or FBGA) package, or other type of BGA package. BGA package 100 includes an integrated circuit die/chip 102, a substrate 104, bond wires (also known as "wire bonds") 106, a plurality of solder balls 108, and an encapsulating material 110. Substrate 104 has a first (e.g., top) surface 112 that is opposed to a second (e.g., bottom) surface 114 of substrate 104. As shown in FIG. 1, chip 102 is mounted to first surface 112 of substrate 104. Chip 102 may be mounted to substrate 104 using an adhesive material (e.g., a chip attach material, not shown in FIG. 1), as would be known to persons skilled in the relevant art(s).

As shown in FIG. 1, a plurality of bond wires 106 are coupled between terminals 116 of chip 102 and electrically conductive features, such as traces, bond fingers, etc. (not shown in FIG. 1), at first surface 112 of substrate 104. For example, a first bond wire 106a is connected between a terminal 116a and first surface 112 of substrate 104, and a second bond wire 106b is connected between terminal 116b and first surface 112 of substrate 104. Any number of bond wires 106 may be present, depending on a number of signals (at terminals 116) of chip 102 to be coupled to conductive features of first surface 112 of substrate 104. Bond wires 106 may be wires formed of any suitable electrically conductive material, including a metal such as gold, silver, copper, aluminum, other metal, or combination of metals/alloy. Bond wires 106 may be attached according to wire bonding techniques and mechanisms well known to persons skilled in the relevant art(s).

As further shown in FIG. 1, encapsulating material 110 covers chip 102 and bond wires 106 on first surface 112 of substrate 104. Encapsulating material 110 protects chip 102 and bond wires 106 from environmental hazards. Encapsulating material 110 may be any suitable type of encapsulating material, including an epoxy, a mold compound, etc. Encapsulating material 110 may be applied in a variety of ways, including by a saw singulation technique, injection into a mold, etc.

Figure 2:
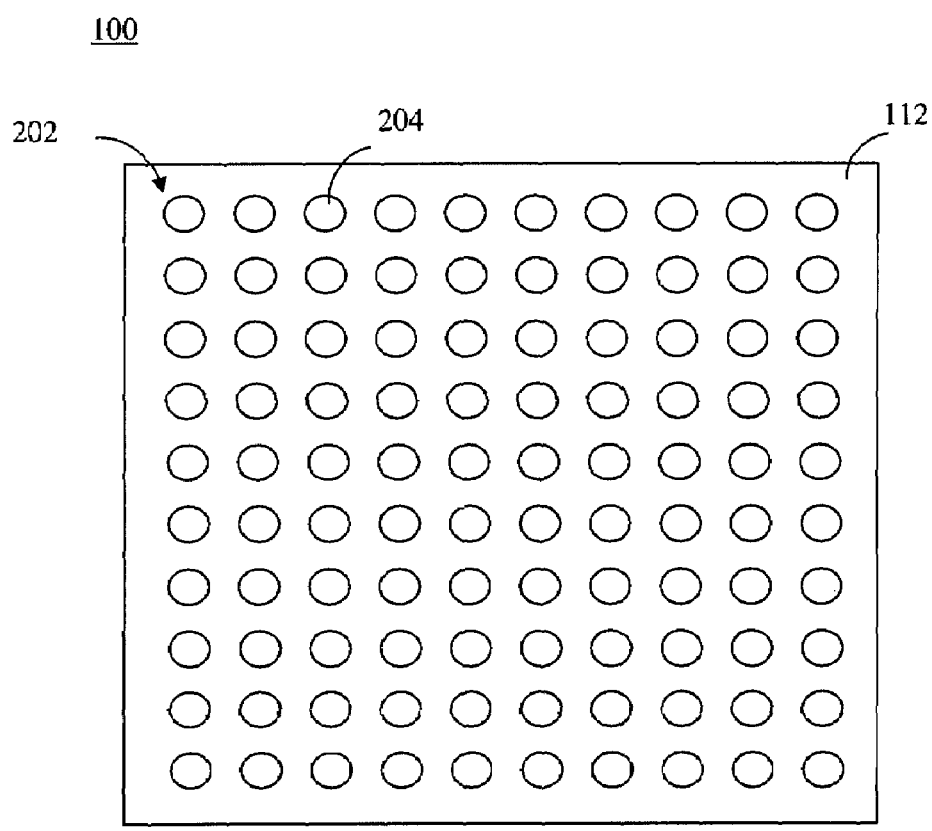
FIG. 2 shows a bottom view of the BGA package of FIG. 1.

A plurality of solder balls 108 (including solder balls 108a and 108b indicated in FIG. 1) is attached to second surface 114 of substrate 104. FIG. 2 shows a plan view of second surface 114 of substrate 104. Solder balls 108 are not shown in FIG. 2. Instead, in FIG. 2, second surface 114 of substrate 104 includes an array 202 of solder balls pads 204. In the example of FIG. 2, array 202 includes one hundred solder ball pads 204 arranged in a 10 by 10 array. In other implementations, array 202 may include fewer or greater numbers of solder ball pads 204 arranged in any number of rows and columns. Solder ball pads 204 are attachment locations for solder balls 108 (shown in FIG. 1) on package 100. Solder ball pads 204 are electrically coupled through substrate 104 (e.g., by electrically conductive vias and/or routing) to the electrically conductive features (e.g., traces, bond fingers, contact regions, etc.) of first surface 112 of substrate 104 to enable signals of chip 102 to be electrically connected to solder balls 108. Note that FIG. 2 shows a full array of solder ball pads 204. In some embodiments, the array of solder ball pads 204 may be missing some pads 204, so that array 202 is not necessarily a full array of solder balls 108 on second surface 114.

Substrate 104 may include one or more electrically conductive layers (such as at first surface 112) that are separated by one or more electrically insulating layers. For example, BGA substrates having one electrically conductive layer, two electrically conductive layers, or four electrically conductive layers are common. The electrically conductive layers may be made from an electrically conductive material, such as a metal or combination of metals/alloy, including copper, aluminum, tin, nickel, gold, silver, etc. In embodiments, substrate 104 may be rigid or may be flexible (e.g., a "flex" substrate). The electrically insulating later(s) may be made from ceramic, plastic, tape, and/or other suitable materials. For example, the electrically insulating layer(s) of substrate 104 may be made from an organic material such as BT (bis-maleimide triazine) laminate/resin, a flexible tape material such as polyimide, a flame retardant fiberglass composite substrate board material (e.g., FR-4), etc.

Other configurations for BGA package 100 are within the scope of embodiments of the present invention. For example, package 100 in FIG. 1 is a die-up type BGA package. Alternatively, package 100 may be configured as a die-down BGA package, where chip 102 is mounted to a bottom surface of package 100 (e.g., second surface 114 of substrate 104). Furthermore, package 100 may include heat spreaders and/or heat sinks configured to spread heat within and/or outside package 100.

Figure 3:
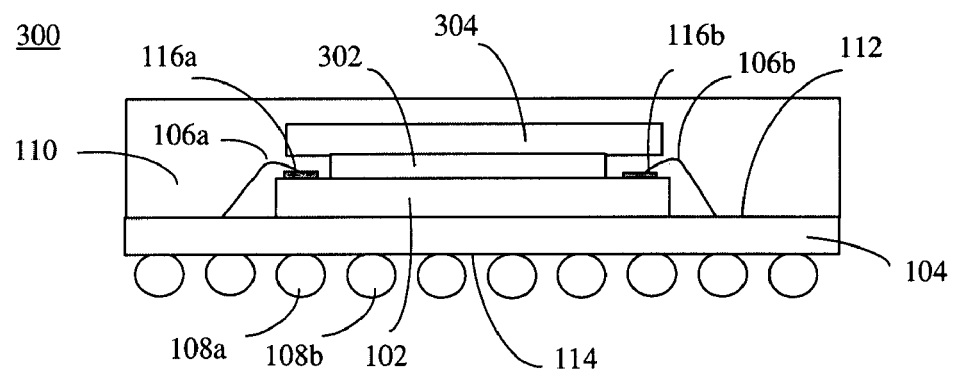
FIG. 3 shows a BGA package having a silicon spacer and a heat spreader.

For example, FIG. 3 shows a BGA package 300 that is generally similar to BGA package 100 of FIG. 1, with the addition of a silicon spacer 302 and a heat spreader 304. Silicon spacer 302 is attached to a top surface of die 102, and heat spreader 304 is attached to a top surface of silicon spacer 302. Heat spreader 304 is shown as a planar piece of a thermally conductive material, such as copper. Silicon spacer 302 is present to space heat spreader 304 sufficiently away from die 102 so that ends of heat spreader 304 do not contact bond wires 106, which could cause them to short. Heat generated by die 102 during operation can be transferred from die 102 to silicon spacer 302, and from silicon spacer 302 to heat spreader 304. Some of the heat transferred to heat spreader 304 may transfer into encapsulating material 110, which may in turn transfer the heat to the environment. However, silicon spacer 302 and encapsulating material 110 are typically not as efficient at transferring heat as heat spreader 304. Thus, heat is not efficiently transferred through silicon spacer 302 to heat spreader 304, or through encapsulating material 110 to the environment. Furthermore, silicon spacer 302 and heat spreader 304 are an additional two parts for package 300, and thus increase costs and package complexity.

Figure 4:
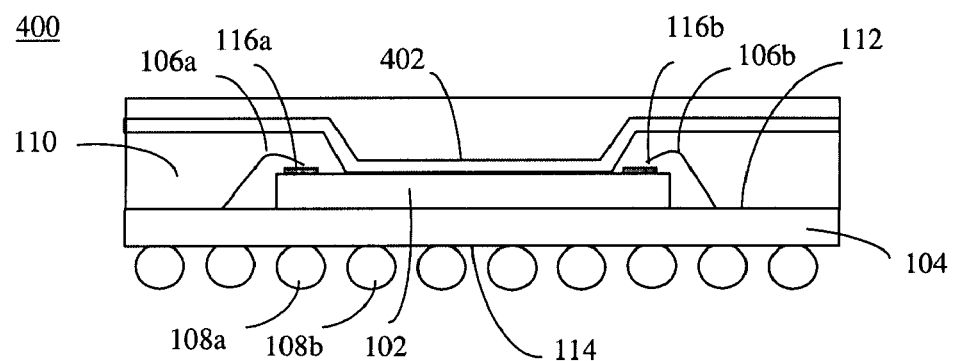
FIGS. 4 and 5 show BGA packages having heat spreaders.

FIG. 4 shows a BGA package 400 that is generally similar to BGA package 100 of FIG. 1, with the addition of a heat spreader 402. Heat spreader 402 is shown as a piece of a thermally conductive material, such as copper, that is generally planar, except for having a central cavity in a top surface, and a corresponding protruding area on a bottom surface. Heat spreader 402 is formed in this manner so that heat spreader 304 does not contact bond wires 106, causing them to short. The protruding area of the bottom surface of heat spreader 402 is attached to a top surface of die 102. Heat generated by die 102 during operation can be transferred from die 102 to heat spreader 402. Some of the heat transferred to heat spreader 402 may transfer into encapsulating material 110, which may in turn transfer the heat to the environment. However, encapsulating material 110 is typically not as efficient at transferring heat as heat spreader 402. Thus, heat is not efficiently transferred through encapsulating material 110 to the environment.

Figure 5:
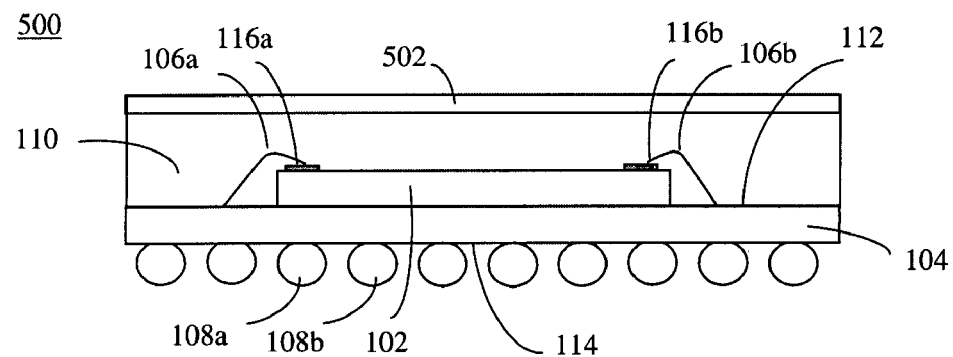

FIG. 5 shows a BGA package 500 that is generally similar to BGA package 100 of FIG. 1, with the addition of a heat spreader 502. Heat spreader 502 is shown as a planar piece of a thermally conductive material, such as copper, that is attached to a top surface of encapsulating material 110, to form a top surface of package 500. Heat spreader 502 is spaced from die 102 by encapsulating material 110. Heat generated by die 102 during operation can be transferred from die 102 through encapsulating material 110 to heat spreader 502, which may in turn transfer the heat to the environment. However, encapsulating material 110 typically is not as efficient at transferring heat as heat spreader 402. Thus, heat is not efficiently transferred from die 102 through encapsulating material 110 to heat spreader 502.

Embodiments of the present invention overcome the heat spreading limitations of packages 100, 300, 400, and 500 shown in FIGS. 1-5, without substantially increasing package cost or substantially increasing assembly process complexity. Example embodiments are further described in the following section.

Example Embodiments

The example embodiments described herein are provided for illustrative purposes, and are not limiting. Although described with reference to BGA packages, the examples described herein may be adapted to various types of integrated circuit packages, including leadframe based packages, such as, but not limited to, QFNs (quad flat package no leads), QFPs (quad flat packages), SSOPs (shrink small-outline packages), and further types of integrated circuit packages. Furthermore, additional structural and operational embodiments, including modifications/alterations, will become apparent to persons skilled in the relevant art(s) from the teachings herein.

Figure 6:
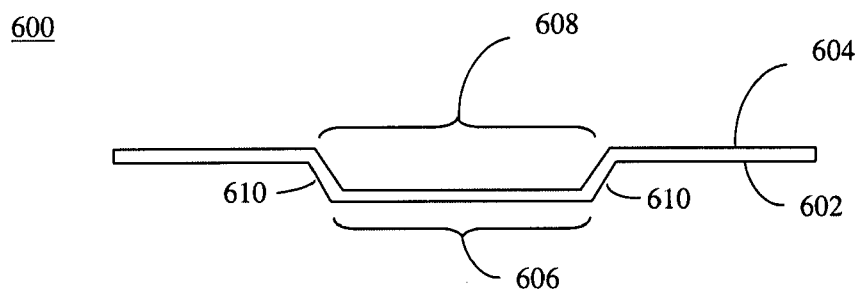
FIGS. 6 and 7 show cross-sectional and plan views of a leadframe that may be incorporated into a BGA package, according to an example embodiment of the present invention.
Figure 7:
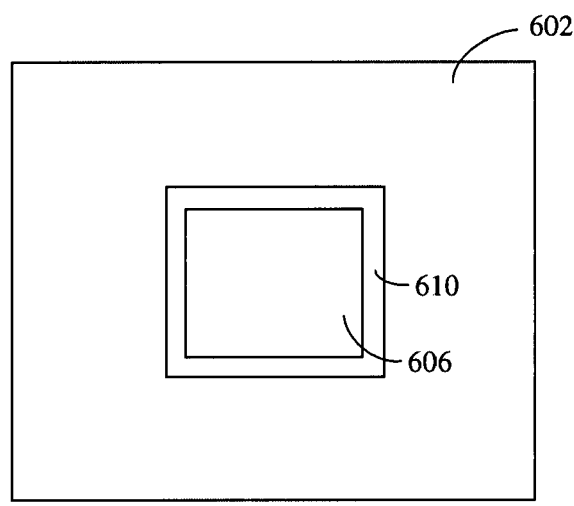

FIGS. 6 and 7 show cross-sectional and plan views of a leadframe 600 that may be incorporated into a BGA package, according to an example embodiment of the present invention. As shown in FIG. 6, leadframe 600 has opposing first and second surfaces 602 and 604, a planar protruding area 606, and a cavity 608. Planar protruding area 606 extends from first surface 602 of leadframe 600 in opposition to cavity 608, which is formed in a central location of second surface 604 of leadframe 600. Second surface 604 of leadframe 600 is generally a planar region, with cavity 608 located centrally therein. Planar protruding area 606 of leadframe 600 is connected to first surface 602 of leadframe 600 by a ring shaped side wall 610. Ring shaped side wall 610 forms an inner side wall of cavity 608. As shown in FIG. 6, ring shaped side wall 610 may be angled (e.g., form a non-90 degree angle) with respect to first surface 602. Alternatively, ring shaped side wall 610 may be formed to be perpendicular to first surface 602.

Leadframe 600 is formed of a thermally conductive material. For example, in an embodiment, leadframe 600 is formed of a metal or includes a metal, such as copper, aluminum, nickel, tin, gold, silver, other metal, or a combination of metals/alloy. Alternatively, leadframe 600 may be formed of another thermally conductive material, such as a thermally conductive ceramic material, a thermally conductive composite material, etc. Protruding area 606/cavity 608 may be formed in leadframe 600 in any manner, including using a molding process, stamping cavity 608 into leadframe 600, etc. Leadframe 600 can have any thickness, as desired for a particular BGA package. For example, leadframe 600 may have a thickness in the range of 5 to 50 mils. In one example FBGA package implementation, leadframe 600 may have a thickness of 8 mils. However, in other FBGA package implementations, leadframe 600 may have other thicknesses.

Figure 8:
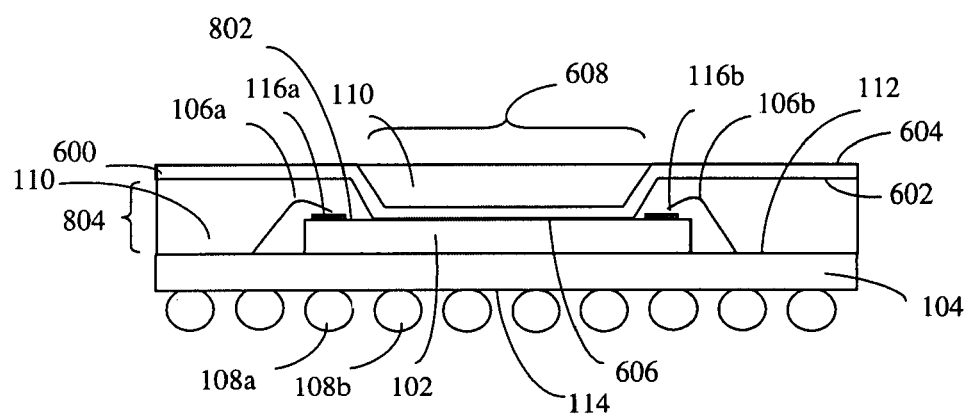

FIG. 8 shows a BGA package 800 that includes leadframe 600, according to an example embodiment of the present invention. BGA package 800 is generally similar to BGA package 100 of FIG. 1, with differences described below. As shown in FIG. 8, planar protruding area 606 of leadframe 600 is coupled to a surface 802 (e.g., top surface) of die 102. Encapsulating material 110 fills a space 804 between first surface 112 of substrate 104 and leadframe 600. Furthermore, encapsulating material 110 fills cavity 608. However, encapsulating material 110 does not cover the planar region of second surface 604 of leadframe 600 surrounding cavity 608.

In FIG. 8, heat generated by die 102 during operation is transferred from die 102 to leadframe 600. The heat transferred into leadframe 600 can be transferred directly to the environment by leadframe 600 from the planar region of second surface 604 of leadframe 600, which is not covered with encapsulating material 110. Thus, the relatively inefficient heat transfer capability of encapsulating material 110 is not a hindrance to transferring heat from die 102 to the environment for package 800.

In the embodiment of FIG. 8, an adhesive material may be present between die 102 and planar protruding area 606 to attach planar protruding area 606 to surface 802 of die 102. Alternatively, planar protruding area 606 of leadframe 600 may be held in contact with surface 802 of die 102 without the use of an adhesive material. For example, encapsulating material 110 may be applied when planar protruding area 606 is in positioned in contact with surface 802 of die 102. When encapsulating material 110 solidifies (e.g., is cured), encapsulating material 110 holds planar protruding area 606 in contact with surface 802 of die 102.

In FIG. 8, the top surface of package 800 formed by the planar region of second surface 604 of leadframe 600 and the top surface of encapsulating material 110 in cavity 608 is planar. Thus, part number, manufacturer, and further/alternative information may be conveniently printed on the top surface of package 800. However, in further embodiments, the top surface of package 800 is not required to be planar. For example, second surface 604 of leadframe 600 may have an alternative shape to enhance heat transfer to the environment. In an embodiment, a heat sink may be attached to the top surface of package 800 to further enhance heat transfer to the environment.

FIG. 9 shows a BGA package 900 that includes leadframe 600, according to another example embodiment of the present invention. BGA package 900 is generally similar to BGA package 800 of FIG. 8, with differences described below. As shown in FIG. 9, package 900 further includes a spacer 902. Spacer 902 couples planar protruding area 606 of leadframe 600 to surface 802 of IC die 102. Spacer 902 may be present in particular package implementations. For example, spacer 902 may be present to space leadframe 600 away from die 102 to provide additional space for bond wires 106 (e.g., to avoid shorting), or to provide shock absorption for die 102 when mounting leadframe 600 to package 900. Spacer 902 may be made from any suitable spacing material, which may be electrically conductive or electrically non-conductive in embodiments. For example, spacer 902 may be made from plastic, ceramic, tape, or silicon in embodiments.

Packages 800 and 900 can be assembled in a variety of ways, including singly or in mass quantities. For example, FIG. 10 shows a flowchart 1000 providing a process for assembling a plurality of integrated circuit (IC) packages, such as packages 800 or 900, according to embodiments of the present invention. The steps of flowchart 1000 do not necessarily have to be performed in the order shown. Flowchart 1000 is described with reference to FIGS. 11-18, which show example views of package assembly, according to embodiments of the present invention. Other structural and operational embodiments will be apparent to persons skilled in the relevant art(s) based on the discussion regarding flowchart 1000. Flowchart 1000 is described as follows.

Figure 11:
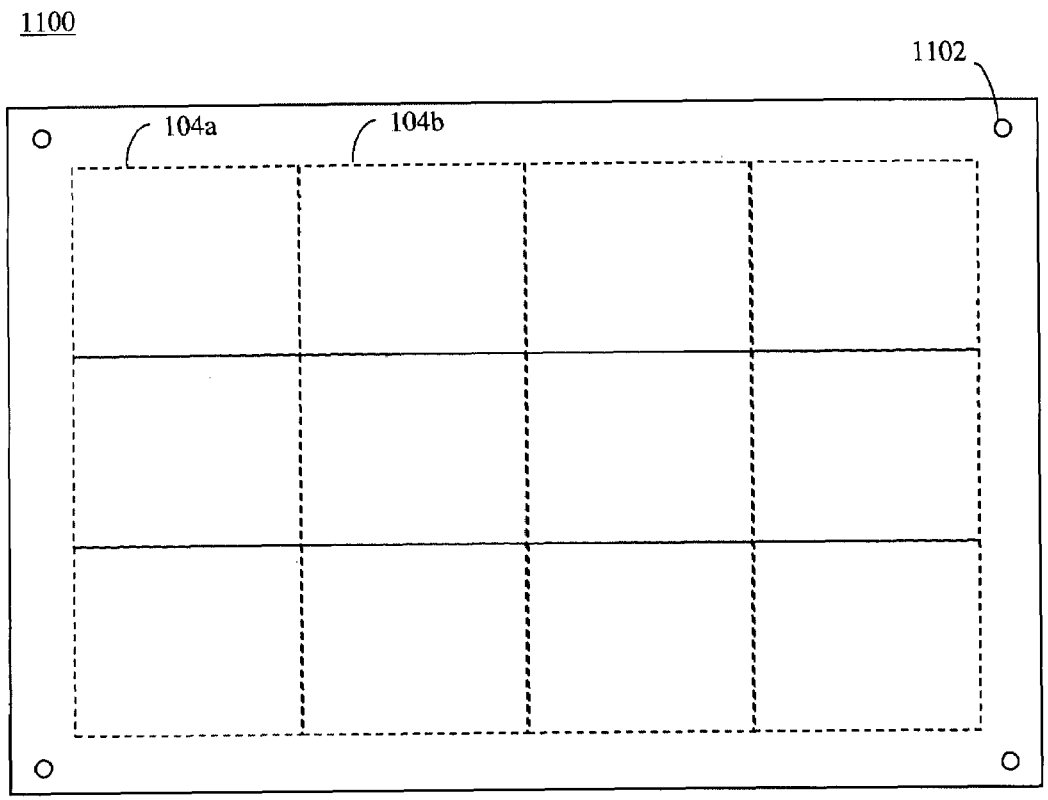
FIG. 11 shows a plan view of a first strip that is sectioned into a 3 by 4 array of package substrates, according to an example embodiment of the present invention.

Flowchart 1000 begins with step 1002. In step 1002, an IC die is mounted to each package substrate section on a first surface of a first strip that includes an array of package substrate sections. For example, FIG. 11 shows a plan view of a first strip 1100 that is sectioned into a 3 by 4 array of package substrates 104 (including package substrates 104a and 104b indicated in FIG. 11). First strip 1100 can include any number of sections of package substrates 104, depending on the particular number of packages desired to be assembled in parallel. First strip 1100 is made of BGA substrate materials, such as those described further above. First strip 1100 may be fabricated according to standard substrate fabrication processes, as would be known to persons skilled in the relevant art(s).

First strip 1100 may include one or more alignment features used to mount and/or align first strip 1100 in an assembly apparatus. For example, mechanical, optical, and/or other types of mounting/alignment features may be used. For instance, first strip 1100 may include one or more tooling or alignment holes 1102, which may be located in corners of first strip 1100 as shown in FIG. 11, and/or in other locations of first strip 1100. Pegs of a mounting/alignment apparatus may be inserted into alignment holes 1102 to mount/align first strip 1100 for processing.

Figure 12:
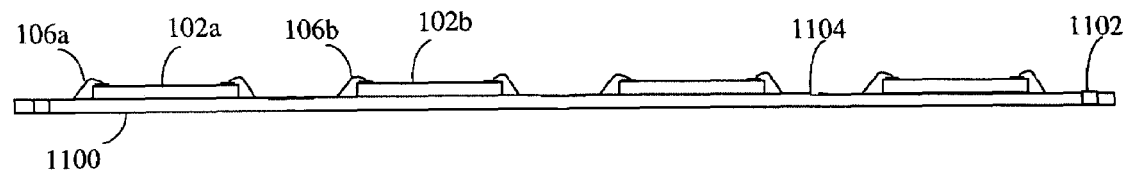
FIG. 12 shows a side cross-sectional view of the first strip of FIG. 11, further showing an IC die mounted to each package substrate of the first strip, according to an example embodiment of the present invention.

FIG. 12 shows a side cross-sectional view of first strip 1100, further showing an IC die 102 mounted according to step 1002 to each package substrate 104 at a first surface 1104 of first strip 1100. For illustrative purposes, dies 102a and 102b are indicated in FIG. 12 as mounted to substrates 104a and 104b, respectively, of first strip 1100. Dies 102 may be mounted to first strip 1100 in any manner. For example, a pick-and-place apparatus may be used to individually mount each die 102 to a respective substrate 104, multiple dies 102 may be mounted to respective substrates 104 in parallel, and/or other techniques may be used to mount dies 102. A die attach material, such as an epoxy, may be applied to a central location of each substrate 104 and/or to a bottom surface of dies 102 to attach dies 102 and substrates 104 together.

Flowchart 1000 may further include a step (not shown in FIG. 10) of connecting a plurality of bond wires 106 between terminals of dies 102 and their respective package substrate 104 sections to which dies 102 are mounted. Example bond wires 106a and 106b are indicated in FIG. 12, respectively connected between dies 102a and 102b and substrates 104a and 104b.

Figure 13:
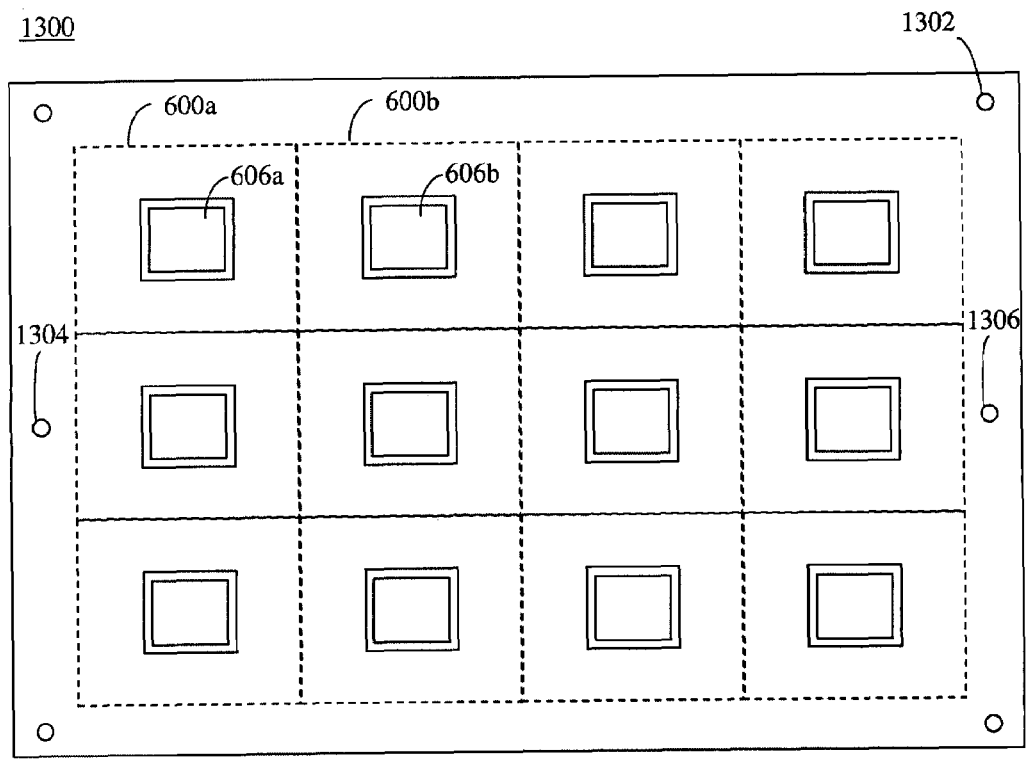
FIG. 13 shows a plan view of a second strip that is sectioned into a 3 by 4 array of leadframes, according to an example embodiment of the present invention.

In step 1004, a first surface of a second strip that includes an array of leadframe sections is positioned adjacent to the first surface of the first strip to couple a planar protruding area of each leadframe section to a corresponding IC die mounted to the first surface of the first strip. For example, FIG. 13 shows a plan view of a second strip 1300 that is sectioned into a 3 by 4 array of leadframes 600 (including leadframes 600a and 600b indicated in FIG. 13). Second strip 1300 can include any number of sections of leadframes 600, typically matching the number of sections of substrates 104 in first strip 1100 shown in FIG. 11. Second strip 1300 is made of a thermally conductive material, which may be one of the materials for leadframe 600 described further above with respect to FIG. 6 or other thermally conductive material. Second strip 1300 may be fabricated according to various fabrication processes, including injecting the thermally conductive material (e.g., a metal) into a mold, by stamping second strip 1300 to create cavities/protruding areas, and/or by further fabrication processes.

For example, in one embodiment, a planar sheet of metal (e.g., copper) of suitable thickness (e.g., 0.010 inches) may be received. The planar sheet of metal may be etched to form any necessary openings through the planar sheet needed for second strip 1300 and/or leadframes 600 (e.g., alignment holes/openings, gas or liquid flow ports, etc.). For example, chemical etching, photolithographic etching, laser etching, drill-based etching, and/or other etching techniques may be used to form openings. The etched planar sheet may be stamped to form cavities 608 (and thus to form protruding areas 606). The etched and stamped planar sheet may be coated, plated, and/or further processed, if desired, resulting in second strip 1300.

Second strip 1300 may include one or more alignment features used to mount and/or align second strip 1300 with first strip 1100 of FIG. 11 in an assembly apparatus. For example, mechanical, optical, and/or other types of mounting/alignment features may be used. For example, second strip 1300 may include one or more tooling or alignment holes 1302, which may be located in corners of second strip 1300 as shown in FIG. 13, and/or in other locations of second strip 1300. Pegs of a mounting/alignment apparatus may be inserted into alignment holes 1302 to mount/align second strip 1300 for processing. Furthermore, as described in further detail below, second strip 1300 may include one or more inlet openings 1304 and one or more outlet openings 1306 used to enable flow of encapsulating material 110. For example, inlet and outlet openings 1304 and 1306 may be located at opposing ends of second strip 1300, and/or at other locations of second strip 1300.

Figure 14:
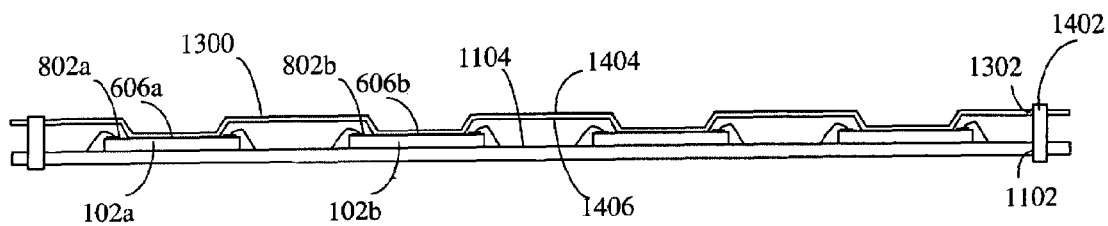
FIG. 14 shows a side cross-sectional view of a strip assembly, according to an example embodiment of the present invention.

FIG. 14 shows a side cross-sectional view of a strip assembly 1400, which includes first strip 1100 and second strip 1300 positioned adjacently. As shown in FIG. 14, a first (e.g., bottom) surface 1406 of second strip 1300 is positioned adjacent to first surface 1104 of first strip 1100 to couple each planar protruding area 606 of leadframe 600 section to a corresponding IC die 102 mounted to first surface 1104 of first strip 1100. In the example of FIG. 14, an alignment member 1402 is inserted in alignment holes 1102 and 1302 of first and second strips 1100 and 1300, respectively, to align first and second strips 1100 and 1300 for processing according to steps 1004 and 1006 of flowchart 1000.

In the embodiment of FIG. 14, each planar protruding area 600 of second strip 1300 is in contact with the top surface of a corresponding die 102. Alternatively, prior to step 1004, a spacer 902 such as shown in FIG. 9 may be attached to the top surface of each die 102 on first strip 1100 and/or to planar protruding areas 606 of second strip 1300, to couple dies 102 to planar protruding areas 606 through spacers 902. In another embodiment, prior to step 1004, an adhesive material may be applied to the top surface of each die 102 on first strip 1100 and/or to planar protruding areas 606 of second strip 1300, to couple dies 102 to planar protruding areas 606 using the adhesive material.

In step 1006, an encapsulating material is applied to the adjacently positioned first and second strips to fill a space between the first and second strips and to fill a centrally located cavity of each leadframe section at a second surface of the second strip. Encapsulating material 110 (e.g., shown in FIG. 8) may be applied to strip assembly 1400 in any manner to fill the space (e.g., space 804 shown in FIG. 8 for package 800) between first and second strips 1100 and 1300, and to fill cavities 608.

Figure 15:
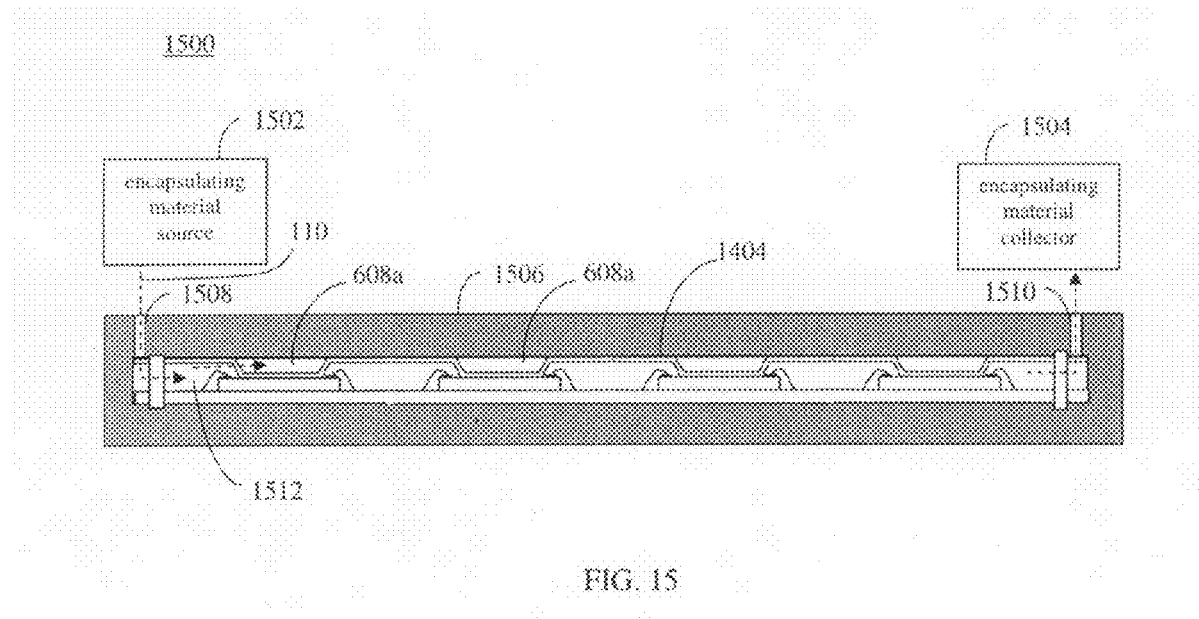
FIG. 15 shows an encapsulating material application system, according to an example embodiment of the present invention.

For example, FIG. 15 shows an encapsulating material application system 1500, according to an example embodiment of the present invention. System 1500 includes an encapsulating material source 1502, an encapsulating material collector 1504, and a mold apparatus (e.g., a mold chase) 1506. As shown in FIG. 15, mold apparatus 1506 encloses strip assembly 1400. Encapsulating material source 1502 applies encapsulating material 110 through an inlet port 1508 in mold apparatus 1506, to inlet opening 1304 in second strip 1300, to enable encapsulating material 110 to enter and fill a space 1512 between first and second strips 1100 and 1300 and to fill cavities 608 (e.g., cavities 608a and 608b) in a first surface 1404 of second strip 1300. Encapsulating material collector 1504 receives excess encapsulating material 110 that passes though outlet opening 1306 of second strip 1300, and through an outlet port 1510 in mold apparatus 1506 to collector 1504. In an embodiment, collector 1504 may apply suction through opening 1306 and outlet port 1510 to aid encapsulating material 110 in flowing through mold apparatus 1506 to collector 1504.

Figure 16:
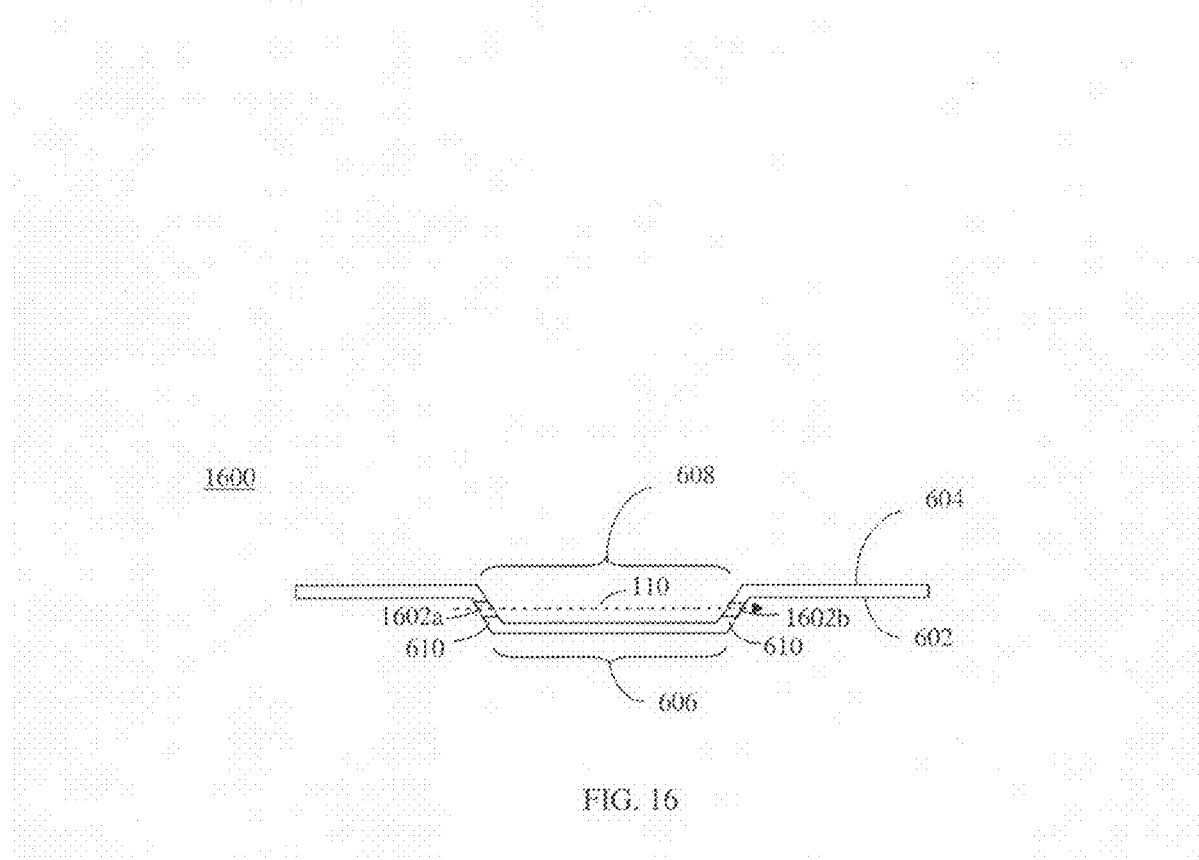
FIG. 16 show an example leadframe with openings configured to enable a flow of encapsulating material into and through the leadframe cavity, according to an example embodiment of the present invention.

FIG. 16 shows an example leadframe 1600 that may be used in second strip 1100 (and may be used in packages 800 and 900 shown in FIGS. 8 and 9) instead of leadframes 600 to enable flow of encapsulating material 110 from space 1512 into cavities 608. Leadframe 1600 is generally similar to leadframe 600, with differences described as follows. As shown in FIG. 16, leadframe 1600 includes a plurality of openings 1602 through side wall 610 of leadframe 1600. A pair of openings 1602 is shown in FIG. 16, although in embodiments, any number of openings 1602 may be present. Openings 610 are positioned in the ring shaped side wall 610 and are open through leadframe 1600 into cavity 608. Thus, openings 610 allow flow of encapsulating material 110 into cavities 608 when present in leadframe sections of second strip 1300. In an embodiment, openings 610 may be positioned in opposing sides of ring shaped side wall 610 so that encapsulating material may flow in one side and other the other side of cavity 608, as shown in FIG. 16. Openings 610 can have any shape, including being round, rectangular/slot shaped, etc.

Figure 17:
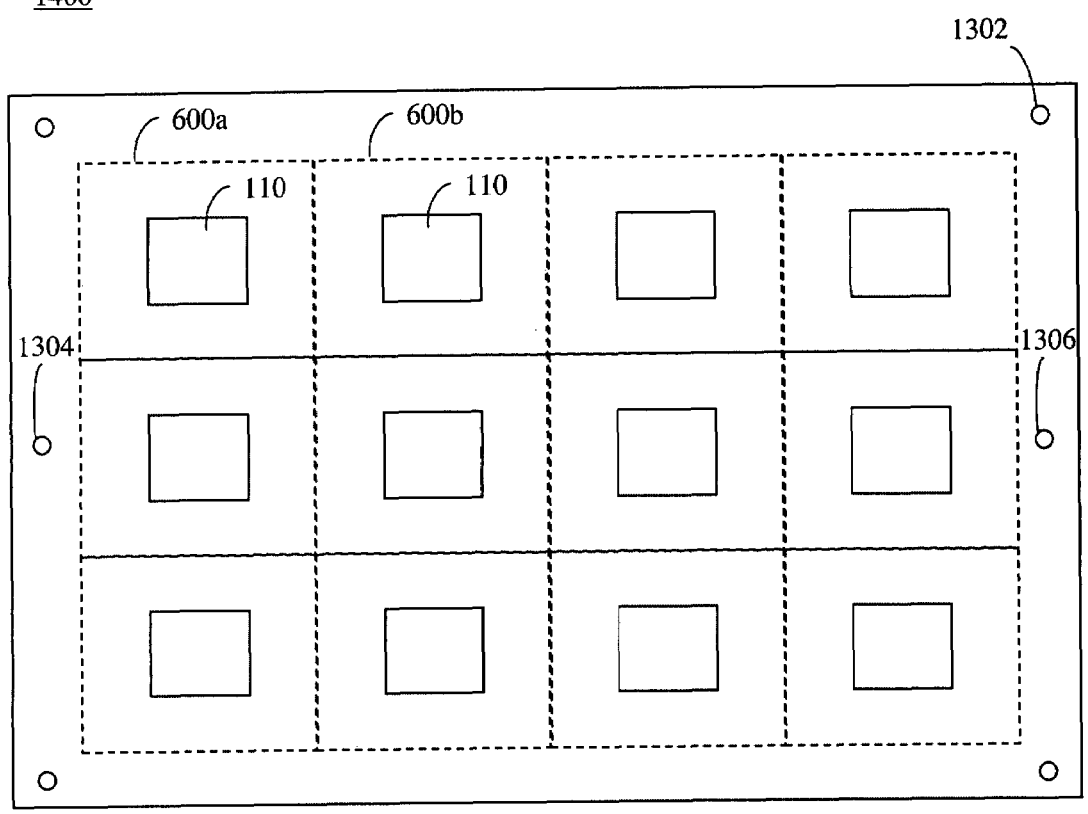
FIG. 17 shows a plan view of the strip assembly of FIG. 14 with an encapsulating material in cavities of the strip assembly, according to an example embodiment of the present invention.

FIG. 17 shows a plan view of strip assembly 1400, where encapsulating material 110 fills cavities 608. Furthermore, as shown in FIGS. 15 and 17, the planar portion of second (e.g., top) surface 604 of each leadframe 600 surrounding cavities 608 is not covered with encapsulating material 110. For example, as shown in FIG. 15, mold apparatus 1506 covers the top surface of each leadframe 600 to keep encapsulating material 110 from covering the top surface of each leadframe 600 except for cavities 608, and to planarize encapsulating material 110 in cavities 608.

Figure 18:
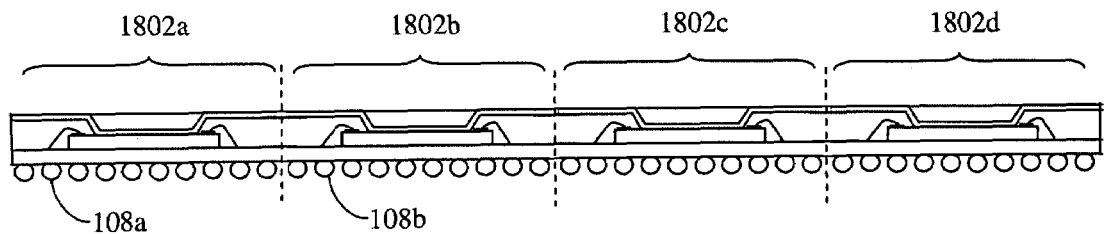
FIG. 18 shows a side cross-sectional view of a strip of completed packages, according to an example embodiment of the present invention.

In step 1008, the adjacently positioned first and second strips are singulated into a plurality of IC packages. For example, FIG. 18 shows a side cross-sectional view of a completed package strip assembly 1800, according to an example embodiment of the present invention. Singulation of strip assembly 1800 separates first strip 1100 and second strip 1300 along the dotted lines shown for each in FIGS. 11 and 13, respectively. Strip assembly 1800 can be singulated in any manner, including by saw singulation, by laser, or other manner, to separate strip assembly 1800 into a plurality of separate BGA packages 1802 (e.g., packages 1802a and 1802b; individual packages 1802 that can be separated from strip assembly 1800 are separated by dotted lines in FIG. 18). Packages 1802 may each be configured by flowchart 1000 as package 800 shown in FIG. 8, or may be configured as package 900 shown in FIG. 9 (if spacers 902 are included), and may include leadframe 600 of FIGS. 6 and 7 or leadframe 1600 of FIG. 16.

In an embodiment, flowchart 1000 may include a step (not shown in FIG. 10) of attaching a plurality of solder balls 108 to the bottom surface of each of the substrates 104 of first strip 1100. The step of attaching solder balls may be performed prior to or after step 1008 of flowchart 1000.

Packages 800, 900, and 1802, which may be formed according to flowchart 1000, provide enhanced thermal characteristics at a relatively low cost. For example, a one piece leadframe strip (second strip 1300) may used to create an entire array of BGA packages, rather than using pick-and-place techniques to couple discrete heat spreaders into different packages. Thus, assembly of packages using the one piece leadframe strip is less complex than conventional package assembly techniques. The leadframe strip can be contacted with dies 102, or coupled closely to dies 102 (e.g., though an adhesive and/or spacer 902), for improved heat conductivity. Furthermore, a planar top region of leadframes 600 is exposed on the top surface of packages 800, 900, and 1802 to provide an efficient thermal path to the environment.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An assembly, comprising:
a first strip that includes an array of package substrate sections;
a plurality of IC dies, wherein each IC die of the plurality of IC dies is mounted to a corresponding package substrate section on a first surface of the first strip;
a second strip that includes an array of leadframe sections that each include a planar protruding area extending from a first surface of the second strip and a centrally located cavity formed in a second surface of the second strip, wherein the second strip is coupled to the first strip such that each planar protruding area of the second strip is coupled to a corresponding mounted IC die of the first strip; and
an encapsulating material that fills a space between the first and second strips and fills the centrally located cavity of each leadframe section, wherein the encapsulating material does not cover a planar region of the first surface of the first strip surrounding each centrally located cavity;
wherein each planar protruding area of the second strip is connected to the first surface of the second strip by a corresponding ring shaped side wall, wherein a plurality of openings is positioned in each ring shaped side wall, the plurality of openings in each ring shaped side wall being open through the second strip into a corresponding centrally located cavity.

2. The assembly of claim 1, further comprising:
a plurality of spacers, wherein each spacer couples a respective planar protruding area of each leadframe section to a corresponding IC die mounted to the first surface of the first strip.

3. The assembly of claim 1, further comprising:
an adhesive material that attaches the planar protruding area of each leadframe section to the corresponding IC die mounted to the first surface of the first strip.

4. The assembly of claim 1, wherein the planar protruding area of each leadframe section is in contact with the corresponding IC die mounted to the first surface of the first strip.

5. The assembly of claim 1, further comprising:
a plurality of solder balls attached to each package substrate section of the array of package substrate sections on a second surface of the first strip.

6. The assembly of claim 1, further comprising:
a plurality of bond wires coupled between terminals of a first IC die and the package substrate section to which the first IC die is mounted.

7. The assembly of claim 1, wherein each ring shaped side wall includes first and second openings positioned in opposing sides of the ring shaped side wall.

8. The assembly of claim 1, wherein the plurality of openings positioned in each ring shaped side wall includes at least one rectangular shaped opening.

9. The assembly of claim 1, wherein the plurality of openings positioned in each ring shaped side wall includes at least one round opening.

10. The assembly of claim 1, wherein each ring shaped side wall is angled with respect to the first surface of the second strip.

11. The assembly of claim 1, wherein each ring shaped side wall is perpendicular to the first surface of the second strip.

12. A ball grid array (BGA) package, comprising:
a substrate that has a plurality of contact pads on a first surface of the substrate that are electrically connected through the substrate to a plurality of solder ball pads on a second surface of the substrate;
an integrated circuit die mounted to the first surface of the substrate;
a leadframe that has a planar protruding area extending from a first surface of the leadframe and a centrally located cavity formed in a second surface of the leadframe, wherein the planar protruding area of the leadframe is coupled to a surface of the IC die; and an encapsulating material that fills a space between the substrate and leadframe and fills the centrally located cavity, wherein the encapsulating material does not cover a planar region of the second surface of the leadframe surrounding the centrally located cavity;

wherein the planar protruding area of the leadframe is connected to the first surface of the leadframe by a ring shaped side wall, wherein a plurality of openings is positioned in the ring shaped side wall, the plurality of openings being open through the leadframe into the cavity.

13. The BGA package of claim 12, further comprising:

a spacer that couples the planar protruding area of the leadframe to the surface of the IC die.

14. The BGA package of claim 12, further comprising:

an adhesive material that attaches the planar protruding area of the leadframe to the surface of the IC die.

15. The BGA package of claim 12, wherein the planar protruding area of the leadframe is in contact with the surface of the IC die.

16. The BGA package of claim 12, further comprising:

a plurality of bond wires coupled between terminals of the IC die and the first surface of the substrate.

17. The BGA package of claim 12, wherein the ring shaped side wall includes first and second openings positioned in opposing sides of the ring shaped side wall.

18. The BGA package of claim 12, wherein the plurality of openings includes at least one rectangular shaped opening.

19. The BGA package of claim 12, wherein the plurality of openings includes at least one round opening.

20. The BGA package of claim 12, wherein the ring shaped side wall is angled with respect to the first surface of the leadframe.

21. The BGA package of claim 12, wherein the ring shaped side wall is perpendicular to the first surface of the leadframe.

* * * * *